United States Patent
Li et al.

(10) Patent No.: US 7,795,968 B1
(45) Date of Patent: Sep. 14, 2010

(54) POWER RANGING TRANSMIT RF POWER AMPLIFIER

(75) Inventors: Yang Li, Cambridge, MA (US); Robert Broughton, Chester, NH (US); James Bonkowski, Cary, IL (US); Peter Bacon, Derry, NH (US)

(73) Assignee: Peregrine Semiconductor Corporation, San Diego, CA (US)

( * ) Notice: Subject to any disclaimer, the term of this patent is extended or adjusted under 35 U.S.C. 154(b) by 53 days.

(21) Appl. No.: 12/319,898

(22) Filed: Jan. 12, 2009

Related U.S. Application Data

(60) Provisional application No. 61/010,824, filed on Jan. 12, 2008.

(51) Int. Cl.
*H03F 3/68* (2006.01)
(52) U.S. Cl. .......................... 330/129; 330/51
(58) Field of Classification Search ................. 330/129, 330/124 D, 51, 302
See application file for complete search history.

(56) References Cited

U.S. PATENT DOCUMENTS

| | | | |
|---|---|---|---|
| 5,883,396 A | 3/1999 | Reedy et al. | |
| 6,057,555 A | 5/2000 | Reedy et al. | |
| 6,090,648 A | 7/2000 | Reedy et al. | |
| 6,531,739 B2 | 3/2003 | Cable et al. | |
| 6,674,323 B2 * | 1/2004 | Kagaya et al. | 330/51 |
| 6,804,502 B2 | 10/2004 | Burgener et al. | |
| 7,215,192 B2 * | 5/2007 | Kim et al. | 330/51 |
| 7,420,412 B2 * | 9/2008 | Kim et al. | 330/51 |
| 7,554,392 B2 * | 6/2009 | Hwa et al. | 330/51 |
| 7,554,394 B2 * | 6/2009 | Maemura | 330/124 R |
| 7,616,054 B2 * | 11/2009 | Jeon et al. | 330/51 |

\* cited by examiner

*Primary Examiner*—Henry K Choe
(74) *Attorney, Agent, or Firm*—Jaquez & Associates; Martin J. Jaquez, Esq.

(57) ABSTRACT

An RF PA operable in two or more selectable power ranges is disclosed. Switches configure the circuit for each range such that an amplifier device corresponding to the range provides final amplification, and all lower power amplifier devices also amplify the signal. An exemplary design includes a low power amplifier configurable for operation solo, or in parallel with a medium power amplifier, to deliver an appropriately matched signal either directly to the RF PA output, or first to the input of a high power amplifier for the highest power range. The signal in all ranges of the exemplary design is conditioned in part by the matching circuitry disposed between the high power amplifier and the RF PA output, which traverses no switches in high power range operation. The entire RF PA, including switches, control and matching circuitry, is fabricated on a single monolithic integrated circuit, an achievement may be facilitated by UTSI CMOS processing.

20 Claims, 2 Drawing Sheets

POWER RANGING TRANSMIT RF POWER AMPLIFIER

This application claims priority under 35 USC 119 to U.S. Provisional Application 61/010,824 filed Jan. 12, 2008 and entitled "Power Ranging Transmit Power Amplifier," the entire contents of which are hereby incorporated herein by reference.

BACKGROUND

1. Field

The present disclosure relates to electronic integrated circuits ("ICs"), and more specifically to RF power amplifier ("PA") integrated circuits.

2. Related Art

Most radio transceivers, such as the cell phones that are a ubiquitous feature of modern life, require an RF PA circuit to boost the transmit signal to a level sufficient to be received by a target transceiver, such as a cellular base station. In this highly competitive field, consumers value increases in transceiver features such as battery life, operational range and signal quality. The RF power amplifier strongly impacts each of these features. Designs that increase signal quality and transmit power will generally increase operational range, but will thereby negatively affect battery life and/or cost unless the PA power efficiency is also increased.

Increases in PA power efficiency will generally enable improvements in battery life for a given signal quality and operational range. Also, because removing waste heat incurs costs, enhancements to efficiency will generally also reduce the costs incurred to remove waste heat. Power efficiency is thus one aspect of the overall cost efficiency of an RF PA designed for a selected performance level. Other aspects of cost efficiency, such as integrated circuit size and other manufacturing considerations, should be concurrently addressed in order to produce an RF PA that provides the best overall value to a user.

Mobile transceivers, such as mobile telephones, must operate at widely varying distances from a base station or other target transceiver, and under widely varying signal path conditions. Accordingly, all well designed cell phones are required to transmit at widely varying power levels. However, a PA design that is highly efficient at a selected first power level is likely to be much less efficient at power levels that are either much higher or much lower than the selected first power level. Accordingly, PAs have been designed to use different physical circuitry depending upon which of two or more ranges the transmit power currently falls within. Such use of separate circuitry entails complex tradeoffs between features such as power efficiency integrated, circuit area, and performance.

It is clearly useful to increase the overall power and cost efficiency of such plural-range RF PAs. Inventive aspects of the power ranging RF PA described herein, used alone or in various combinations, will contribute to such overall power and/or cost efficiency of an RF PA embodying such aspects.

SUMMARY

One aspect of the present teachings is an RF PA that amplifies an RF signal in a selectable plurality of output power ranges and comprises a plurality of distinct active amplifier circuit devices. The RF PA is fabricated such that during operation in a high power range, a lower power active amplifier device amplifies the signal first, while a distinct high power active amplifier circuit device subsequently provides final amplification of the signal, but during operation in a lower power range, the lower power active amplifier circuit device provides the final signal amplification. The RF PA may be further defined by requiring any combination of the following additional features insofar as they are functionally compatible. The additional features may include the following: the RF PA may be required to be fabricated entirely on a single contiguous integrated circuit die; and/or the RF PA may be required to comprise only active devices that are fabricated by a common set of semiconductor processing techniques associated with a particular type of semiconductor wafer; and/or the RF PA may comprise a single type of semiconductor wafer, or it may be entirely integrated on a single semiconductor wafer; and/or the RF PA may required to have no active, switchable path in series with the signal subsequent to the high power active amplifier circuit; and/or the RF PA may be required to actively switch impedance matching elements between the high and lower power modes, in which case the RF PA may be further required to incorporate all such switched impedance matching elements as part of the same semiconductor die(s) incorporating the active amplifier circuit devices, and/or it may be further required to incorporate all active devices that switch the impedance matching elements on the same semiconductor die(s); and/or the RF PA may be required to amplify the signal by each of the plurality of active amplifier circuit devices in a high power mode, while in the lower power mode quiescent (bias) current in the high power active amplifier circuit device is substantially disabled, which may mean that its quiescent current is reduced to a value that is less than 5%, or less than 2%, or less than 1%, or even less than 0.5% of its quiescent current when operating in the high power mode; and/or the RF PA may be required to have a multiplicity of distinct amplifier circuit devices that all amplify the signal in the high power mode; and/or all active devices of the RF PA may be required to be FETs having an insulated gate; and/or the RF PA may be required to consist of only one, or alternatively of at least one, semiconductor die having a fully insulating substrate; and/or the RF PA may be required to be implemented in silicon on insulator (SOI) semiconductor material; and/or the RF PA may be required to comprise of a solitary, or alternatively of at least one, silicon on sapphire semiconductor die; and/or the RF PA may be required to incorporate mode and bias control circuitry for all active amplifier circuit devices on its semiconductor die(s).

Another aspect of the present teachings is a method of providing plural-range power amplification for an RF signal in a portable transceiver by amplifying the signal differently in a high power mode than in a lower power mode. In the high power mode, the presented disclosure includes steps of amplifying the signal first through a lower power amplifying circuit device, then providing the signal thus amplified to an input of a high power amplifying circuit device for final amplification; while in the lower power mode, it includes steps of amplifying the signal through the lower power amplifying circuit device and providing no further subsequent amplification. This method may be further defined by requiring any combination of the following features and steps, insofar as they are functionally compatible, including the following: all amplification and signal processing of this method may be required to be performed on a single contiguous integrated circuit die, and/or only on semiconductor dies fabricated by a common set of semiconductor processing techniques associated with a particular type of semiconductor wafer, and/or on only a single type of semiconductor wafer; and/or the method may be required to avoid any active series switching of the signal subsequent to an output of the high power amplifier; and/or the method may be required to actively switch connections between impedance matching elements between the high and lower power modes such that the output signal is matched differently in the high power mode than it is in the lower power mode; and/or the method may be required to include switching all such impedance matching elements, and/or to include incorporating all such impedance matching elements, on the semiconductor die(s); and/or the method may be required to amplify the signal by each of the plurality of active amplifier circuit devices in a high power mode, while substantially disabling quiescent (bias) current in the high power active amplifier circuit device in the lower power mode, such that in the lower power mode the quiescent current of the high power amplifying circuit device is reduced to a value that is less than 5%, or less than 2%, or less than 1%, or even to less than 0.5% of the quiescent current of the high power device when operating in the high power mode; and/or the method may be required to amplify the signal through three distinct power amplifying circuit devices in the high power mode, and through less such devices in a lower power mode; and/or the method may be required to include performing all amplification and switching in FETs having an insulated gate; and/or the method may be required to perform all amplification and switching on (a) semiconductor die(s) that: have a fully insulating substrate, or further are Silicon On Insulator (SOI), or further comprise Silicon On Sapphire (SOS), or further are Ultra-Thin SOS.

BRIEF DESCRIPTION OF THE DRAWINGS

Embodiments of the present invention will be more readily understood by reference to the following figures, in which like reference numbers and/or designations indicate like elements.

DETAILED DESCRIPTION

Figure 1:
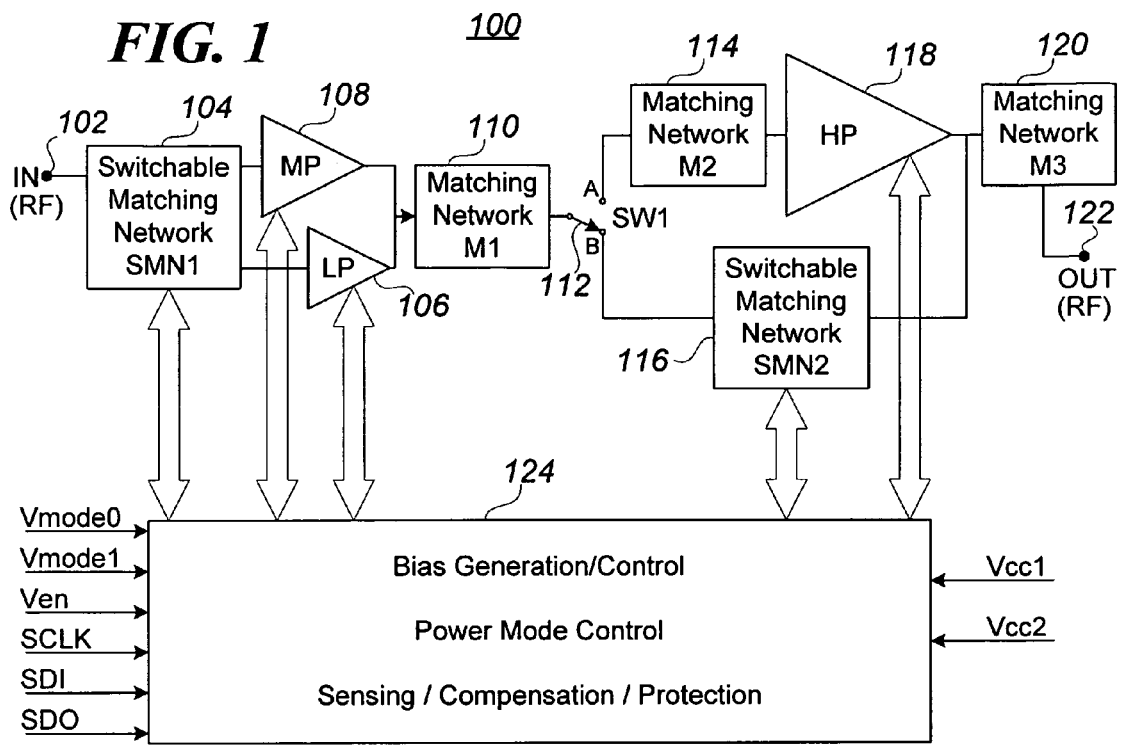
FIG. 1 is a block diagram of an exemplary embodiment of an RF PA, or related method, as described herein.

Embodiments of RF PAs (Radio Frequency Power Amplifiers) as described herein may generally be fabricated using any number of alternative semiconductor materials and manufacturing processes, as will be appreciated by those who are knowledgeable and experienced in respect of such alternative semiconductors and processes. However, the preferred embodiments have been developed in accordance with an Ultra Thin Silicon on Insulator semiconductor, and corresponding processing steps, because that is the semiconductor type with which the inventors presently work most often. Only reasonable experimentation will be required to adapt the structures and methods described herein for such alternative semiconductor types and processes. Hence, such alternative embodiments are fairly taught by the description set forth below, and are encompassed by any statement or claim that defines the invention without explicitly excluding or rendering such alternative embodiments incompatible. Details of the preferred semiconductor and processing techniques are known in the art, and include integrated circuit processing that is identified in the US patent literature as UTSI (Ultra Thin Silicon on Insulator) CMOS processing.

It is highly desirable for an RF PA to maintain both high efficiency and high linearity. At least some radio communications, such a Wideband CDMA (WCDMA) provide a power ranging control, so that a PA may be operated in different power modes and thereby achieve higher efficiency and linearity across a wider range of transmit powers. An embodiment of an RF PA described herein operates in three distinct power modes: a low power mode (LPM), a medium power mode (MPM), and a high power mode (HPM).

WCDMA systems, as one example, change the output power of power amplifiers dynamically based on a power control mechanism, with the normal power range during operation about 10-20 dB lower than the maximum output power. The efficiency of power amplifiers decreases rapidly as output power decreases, resulting in low overall efficiency in systems that operate a substantial portion of the time at such output powers, precisely because they are far below the maximum output power. To improve overall power efficiency, dual or even triple power mode PAs may be employed. A triple power mode PA is likely to provide about 5% longer battery life as compared to a similarly well-designed dual power mode PA used in the same WCDMA application.

Transistor bias tuning technology in existing plural-power mode PA have resulted in impedance matching that is not optimized in low power mode, due in part to the priority that has been given to efficiency in the highest power mode. This has resulted in average efficiency that is degraded below its potential. Consequently, achieving overall efficiencies that are acceptable has required the use of expensive semiconductor processes such as, for example, InGaP HBT.

To enable better average efficiency in lower cost processes, such as CMOS, several architectures have been proposed, such as, for example, Quasi-Doherty, DC-DC converter for bias supply, and digital pre-distortion for linearization. Quasi-Doherty requires a high Q quarter wavelength transmission line which is relatively large in size. The DC-DC converter architecture needs a high efficiency DC-DC converter with a big capacitor and inductor which cannot easily be integrated. Digital pre-distortion architecture consumes extra power, and has limitations at lower output levels. Hence, these alternatives are more expensive than is desirable for mass production.

In order to address the need for high overall efficiency and low cost, a CMOS RF PA is described that may employ three power modes, using techniques for path sharing and switching. The RF PA may include three distinct PA device blocks, a single pole double throw (SPDT) MOSFET RF switch, and both switchable and nonswitchable matching networks. Advantages may accrue from fabricating the entire RF PA, including not only the switching circuit elements but also the matching network circuit elements, on a single semiconductor die, as this will reduce the number of external connections and devices that must be connected to the RF PA in a transceiver. The exemplary embodiment is fully integrated on a single semiconductor die. However, yield, process abilities, and other economic considerations may dictate fabrication on two or more semiconductor dies in some embodiments.

FIG. 1 illustrates an architecture for an exemplary embodiment of the RF PA 100. The RF-in signal at the input node IN 102 is coupled into a Switchable Matching Network block SMN1 104. From there it is coupled to the small PA device block LP 106 and/or to the medium PA device block MP 108. The outputs of these two blocks are substantially coupled together as they enter a first matching network M1 110. An RF Switch SW1 couples the signal from M1 110 either to a second matching network M2 114 (switch connection A), or to a second Switchable Matching Network SMN2 116 (switch connection B). If connected to M2 114, the signal is propagated to the input to a large PA device block HP 118.

The three PA device blocks LP 106, MP 108 and HP 118 will generally be referred to hereafter as simply LP 106, MP 108 and HP 118, respectively, thus more clearly indicating their corresponding function as Low Power, Medium Power, and High Power amplifying devices. If the signal output by M1 110 is coupled to SMN2 116, it is routed to the output of HP 118, rather than to the input of HP 118. From the output of HP 118, the signal is input to a third matching network M3 120, preferably with no further switching in series with the signal beyond that point. The output of M3 120 is simply RF-out, which is the output of the RF PA provided at the output node OUT 122.

In low power mode, only LP 106 is enabled, and the SPDT switch SW1 112 is configured such that the signal bypasses the largest PA device block HP 118. In medium power mode, the small and medium PA device blocks LP 106 and MP 108 are both enabled by biasing them to a desirable operating range, while HP 118 is disabled. In high power mode, all three PA device blocks LP 106, MP 108 and HP 118 are enabled, and the SPDT switch SW1 112 is configured such that the signal is coupled from M1 110, via M2 114, to HP 118 for final amplification. In the exemplary embodiment, the signal is routed to the output of HP 118 even when HP 118 is disabled.

Disabling HP 118 does not necessarily reduce the bias voltages and quiescent current to zero. However, HP 118 may be substantially disabled by reducing its "disabled" quiescent current to a small fraction of the quiescent current it conducts in high power mode. As compared to the high power mode quiescent current in HP 118, HP 118 may be substantially disabled by biasing it such that its quiescent current is reduced to between 5% and 0% of the high power mode quiescent current. In particular, it may be desirable to limit the "disabled" quiescent current to 5%, 2%, 1%, 0.5%, 0.2%, 0.1%, or even 0% of the high power quiescent current. The particular range will be selected based on a number of factors that depend, in part, upon the particular process by which the RF PA 100 is fabricated. However, the "disabled" current of HP 118 may also depend in part on the particular matching network designs that are selected, because it may affect the impedance at the output of HP 118.

It is notable that the design set forth here enables the quiescent current of HP to be further reduced, in modes other than high power mode, than in some competing designs. Such competing designs may suffer reduced efficiency in lower power modes due to having a relatively high quiescent current in a larger PA amplifier in such modes. This may be particularly true when the highest power PA device in such competing designs is coupled in parallel with a lower power PA device (i.e., the outputs of the highest power PA device and a lower power PA device are closely coupled), or when matching network elements cannot readily be switched in or out to more optimally control impedance matching. In the exemplary embodiment, the quiescent current of HP 118 in low and medium power modes is reduced as nearly as practical to 0% of its quiescent current during high power operation, typically less than 0.1% of high power quiescent current.

In the exemplary design, no switchable signal path exists in series between the output of HP 118 and the output node OUT 122 of the RF PA 100. This avoids a significant source of insertion loss that might be incurred by architectures that compensate for impedance differences between different power modes by changing the matching network in the signal path subsequent to the highest power amplifying device (i.e., HP 118).

In the exemplary design, the impedance of the path bypassing HP 118, which includes the switchable matching network SMN2 116, operates at the relatively lower signal currents of the LP and MP modes. As such, compared to the matching network M3 120, SMN2 116 may have higher impedance, yet still maintain a higher Quality factor (Q) than could easily be achieved in a series-coupled matching network subsequent to the highest power amplifier, such as M3 120. Moreover, because the signal path is switched only prior to the output of the largest PA block HP 118, the signal switches and switched matching networks operate at signal levels that are far below the maximum output signal level. Consequently, despite signal path and matching network switching, a plural-range PA like the exemplary design may achieve overall efficiencies, in high power mode, that are close to those obtainable in a PA having only a single power mode. Of course, plural-power-range PAs such as the exemplary design may be optimized to achieve higher efficiencies in lower power modes, an advantage that is not available to a single power mode PA.

The switchable matching networks and bias of the PA device blocks are adjusted to optimize PA performance independently in each of the three modes of the exemplary embodiment. The PA devices LP 106 and MP 108 that serve as the final amplifiers in low and medium power modes, respectively, both amplify the signal when operating in high power mode, thereby reducing the overall circuit size. The biases of the PA device blocks are separately controlled, and are tuned depending on the different modes in order to obtain better performance. The small and medium devices operate in parallel in medium and high power modes. By separately biasing the two devices, linearity can be improved for selected signal amplitudes, particularly at close to maximum output power levels for the selected mode.

In one embodiment, circuitry in a Bias Generation/Control block 124 may provide the varying bias for the different PA devices, control the configuration switches in the Switchable Matching Networks, and may also provide protection by sensing overvoltage or over current conditions, and thereupon disable the amplifier. The circuitry can include registers, look-up tables, and serial communication elements in order to minimize the number of connections needed for the RF PA.

A CMOS process is preferred for fabricating some RF PA embodiments as described herein, partly because it is a relatively low cost process, but also because it lends itself to incorporation of supporting electronics within the semiconductor device(s) comprising the PA. One embodiment disposes the entire PA on a single integrated circuit die, but this may not always be desirable. Even if a single die is not sufficient for some embodiments, it is desirable to have the entire PA be fabricated using a single type of semiconductor processing. Thus, for example, a CMOS Ultra Thin Silicon on Insulator (UTSI) semiconductor process may be used for all components of the PA. Using such a CMOS structure makes it relatively easy to include, on the PA IC die(s), all the necessary bias generation and control circuitry, the power mode control, and any sensing, compensation and/or protection that may be needed. These functions are represented in FIG. 1 by a block 124 that has, as inputs, two power mode control lines Vmode0 and Vmode1, an enable line Ven, a clock SCLK, and inputs SDI and SDO, as well as power supplied by power supply lines Vcc1 and Vcc2.

This exemplary RF PA design is fabricated in a CMOS process, and has leveraged flexible bias control and switchable matching network to obtain high efficiency and good isolation. The switchable matching network consists of capacitors, inductors and MOSFET switches. The MOSFET switch is used to change the topology of the matching network and/or value of components in the matching network. Capacitor elements may be implemented as drain-source coupled (capacitor-connected) FET devices if the working voltages will be lower than the relevant FET breakdown voltages. For higher voltage capability, the capacitors may be formed for example by a metal-insulator-metal (MIM) process, in which the insulator may be made as thick as needed.

The UTSI CMOS process upon which the exemplary embodiment is based may be understood and practiced by reference to the following documents, all of which are hereby incorporated herein in their entireties: U.S. Pat. No. 6,804,502 to Burgener, et al., entitled "Switch circuit and method of switching radio frequency signals" and issued Oct. 12, 2004; U.S. Pat. No. 6,531,739 to Cable, et al., entitled "Radiation-hardened silicon-on-insulator CMOS device, and method of making the same" and issued Mar. 11, 2003; U.S. Pat. No. 6,090,648 to Reedy, et al., entitled "Method of making a self-aligned integrated resistor load on ultrathin silicon on sapphire" and issued Jul. 18, 2000; U.S. Pat. No. 6,057,555 to Reedy, et al., entitled "High-frequency wireless communication system on a single ultrathin silicon on sapphire chip" and issued May 2, 2000; and U.S. Pat. No. 5,883,396 to Reedy, et al., entitled "High-frequency wireless communication system on a single ultrathin silicon on sapphire chip" and issued Mar. 16, 1999.

FETs fabricated according to a UTSI CMOS process typically have relatively low gate-drain and gate-source breakdown voltages. Accordingly, active switching and amplifying devices may be fabricated using stacks of FETs arranged in series connection to increase the net drain-source breakdown voltage, if necessary. "RF switch" devices, used for switching signal paths and matching circuit elements are designed to merely conduct or not, rather than to actively amplify the RF signal. Such switches are described in more detail in the US patents set forth in the preceding paragraph.

The active amplifier devices, or PA blocks, are now described in more detail. It may be convenient to fabricate all of the active amplifying devices as parallel and series combinations of a single "unit cell," such as that illustrated in FIG. 2.

Figure 2:
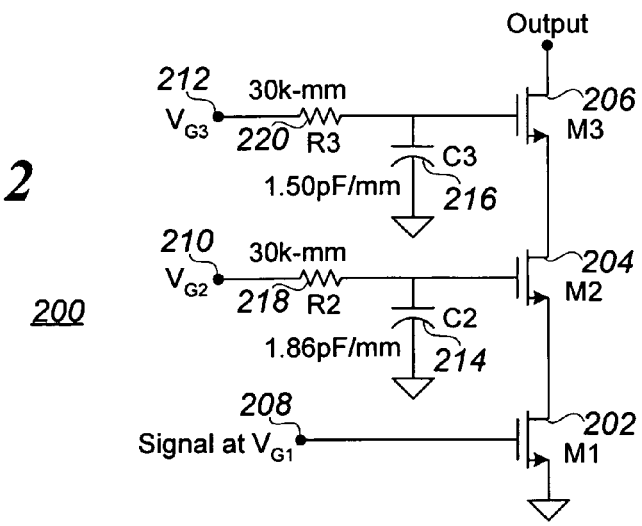
FIG. 2 illustrates an exemplary unit cell that includes three stacked FET devices with supporting circuitry that may be combined to form three different sizes of PA.

FIG. 2 shows a unit cell 200 that includes three insulated-gate NMOS FETs M1 202, M2 204 and M3 206 coupled in series (or "stacked"). The signal Signal, appropriately biased with bias voltage $V_{G1}$ (not shown), is applied to the input 208 of M1 202. $V_{G2}$ 210 and $V_{G3}$ 212 comprise the bias voltages for M2 204 and M3 206, respectively. The signal voltage appearing from drain to source, as well as from gate to source and drain to gate, depends upon the parasitic drain-gate and gate-source parasitic capacitances in conjunction with the decoupling capacitors C2 214 and C3 216 for their corresponding FETs M2 204 and M3 206. For the exemplary unit cell, C2 may provide 1.86 pF/mm, and C3 may provide 1.5 pF/mm, while both R2 218 and R3 220 provide 30 kΩ-mm. M1 202, M2 204 and M3 206 are all N channel FETs and each FET include 2 sections, each having a channel 11.2 μm wide and 0.25 μm long. The skilled designer will understand that different processes produce different values of parasitic capacitance for M2 204 and M3 206, and will be able to adjust C2 214 and C3 216 accordingly. Higher voltage FET devices, or lower power demands, may obviate a need for stacked (cascode-like series connected) FETs. Such different devices may accordingly require entirely different bias considerations which, nonetheless, will be readily determined by those skilled in the corresponding design process.

A nominal embodiment of the unit cell has $V_{DD}$ (not shown) at 3.4 V, $V_{G2}$2=1 V, $V_{G3}$3=2V. By setting the DC level of the signal 208 at a suitable value ($I_{DD}$ bias) that is dependent on the threshold voltage of M1 202, the unit cell conducts a quiescent current of about 75 μA. In an exemplary embodiment of the RF PA of FIG. 1, the LP 106 may consist of about 27 of these unit cells coupled in parallel, for a total width of about 0.6 mm and a nominal quiescent current of about 2 mA; the MP 108 may consist of about 196 cells for a width of about 4.4 mm and quiescent current of about 14.7 mA; and the HP 118 may consist of about 1768 of such cells, with a total width and quiescent current scaling accordingly. Note that the quiescent current is nominal when the devices are operating as a final amplifier; the biasing and hence quiescent current in LP 106 and MP 108, in particular, may be varied when these devices operate in parallel, and/or when they operate as a preamplifier for the final stage HP 118. Fabrication using means of parallel combinations of unit cells has certain advantages, such as helping to ensure uniform voltages to all portions of an overall stage. However, it has certain disadvantages as well, such as that each of the unit cell bias resistors R2 and R3 are effectively arranged in parallel, thus requiring numerous resistors of correspondingly larger resistance. Fabrication as described is nonetheless preferred for use with a low voltage UTSI CMOS process, but the skilled person will readily adapt fabrication to suit other fabrication processes and preferences.

Figure 3:
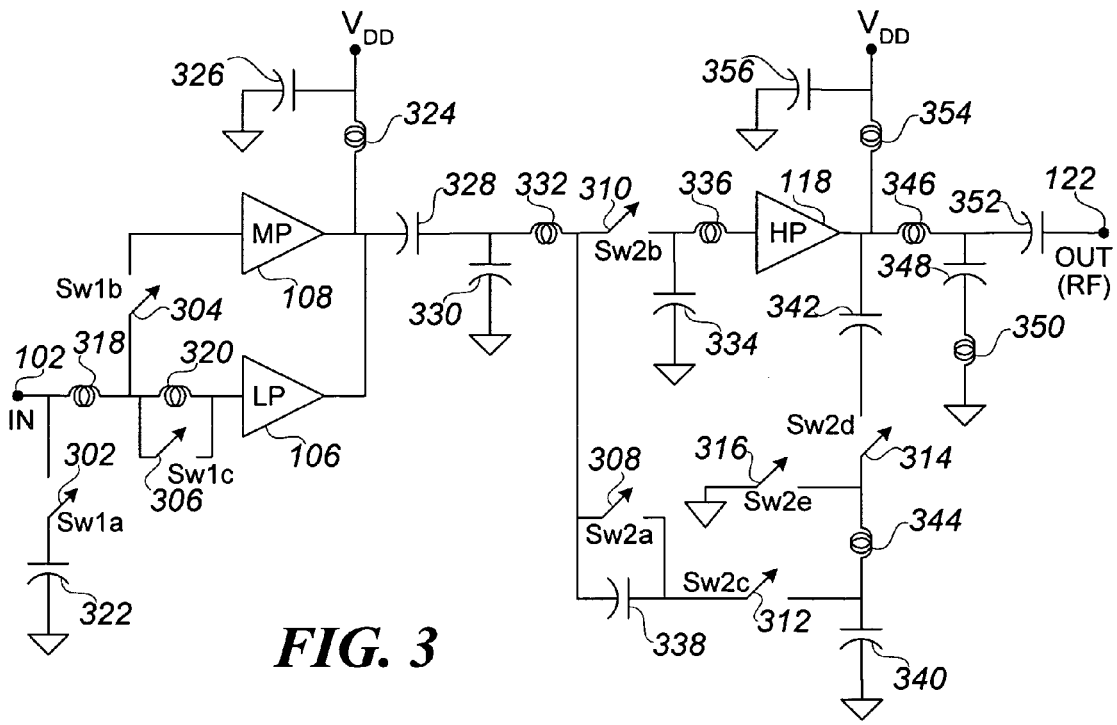
FIG. 3 is a simplified schematic diagram of the primary signal conditioning portions of an exemplary RF PA as described herein.

FIG. 3 illustrates some details of an exemplary embodiment of the RF PA of FIG. 1. However, it must be borne in mind that details of the matching networks necessarily depend on performance details of the amplifying blocks LP 106, MP 108 and HP 118, and hence the exact value of the matching network devices is best left as a design choice. A skilled designer will be able to easily determine reasonably optimal trade-offs between amplifier impedances and those inductive and capacitive matching elements that are suitable for fabrication on an integrated circuit, or which may readily be coupled to the circuit from an off-chip location. The following table indicates switch conditions for the three operational modes: low power mode (LPM), medium power mode (MPM) and high power mode (HPM):

TABLE 1

FIG. 3 Switch Conditions vs. Power Mode

| | LPM | MPM | HPM |
|---|---|---|---|
| Sw1a 302 | Open | Closed | Closed |
| Sw1b 304 | Open | Closed | Closed |
| Sw1c 306 | Open | Closed | Closed |
| Sw2a 308 | Closed | Open | Open |
| Sw2b 310 | Open | Open | Closed |
| Sw2c 312 | Closed | Closed | Open |
| Sw2d 314 | Closed | Closed | Open |
| Sw2e 316 | Open | Open | Closed |

The input switchable matching network SMN1 104 of FIG. 1 may include inductors 318 (1.8 nH, Q about 20) and 320 (3.6 nH, Q about 16), together with a capacitor 322 (8 pF). All configuration switches, including switches 302, 304 and 306 in SMN1, may comprise N channel FETs, which may, in one embodiment, be arranged in series (stacked) if higher withstand voltage is required. Inductor 324 (2 nH, Q about 36) and capacitor 326 (18 pF) may be considered as decoupling the output of LP 106 and MP 108 from the supply $V_{DD}$, and in will affect the signal impedance. Matching network M1 110 of FIG. 1 may include capacitor 328 (8 pF), capacitor 330 (2 pF), and inductor 332 (4.5 nH, Q about 13).

SW1 112 of FIG. 1 is effected by a combination of Sw2b 310 and Sw2c 312. As may be seen from Table 1, switches 310 and 312 are actuated in opposite modes. When operating in HP mode, switch 310 is closed, coupling the signal from inductor 332 to a capacitor 334 (16.9 pF) and inductor 336 (0.49 nH, Q about 30) which together may serve as M2 114 of FIG. 1. When operated in LP and MP modes, switch 310 is open and switch 312 is closed, coupling the signal from inductor 332 (or M1 110) to the second switchable matching network SMN2 116 of FIG. 1. Switches 312 and 314 are always closed when the signal is directed through SMN2 116 by "SW1" 112 of FIG. 1. Switches 312 and 314 thus serve only to couple or decouple SMN2 116 from the signal path of the RF PA, and therefore do not change the matching effected by the network when in operation. The network may include capacitors 338 (2.4 pF), 340 (2.8 pF) and 342 (5.8 pF), and inductor 344 (2.2 nH, Q about 21).

When operated in LP (low power) mode, only amplifier device LP 106 is biased for substantial amplification. When operated in medium power mode, both LP 106 and MP 108 are biased for substantial amplification. When they operate in parallel, the bias to the two devices may be optimized to cancel nonlinear distortion at close to maximum output power levels, as noted above with respect to FIG. 1.

The output matching network, M3 of FIG. 1, is not switchable and is always in the signal path in the exemplary embodiment. The inductors may therefore have low resistance for low insertion loss. It may include an inductor 346 (1.5 nH, Q around 38), and may also include a capacitor 348 (3 pF) in series connection with an inductor 350 (0.56 nH, Q about 30). The capacitor C31, in one variation of the exemplary embodiment, is external to the integrated circuit upon which the RF PA is fabricated, and may serve to couple the signal to the antenna. Alternatively, it may be fabricated on the IC in order to have good matching with the other components of the network. When the circuit is fabricated with capacitor 352 "off-chip," output node OUT 122 is then coupled directly to the junction of capacitor 348 and inductor 346. The nominal or intended impedance of the signal at the output node OUT 122, in that case, may vary somewhat in both real and imaginary components from the case in which capacitor 352 is on-chip. Because capacitor 352 is optionally off-chip for antenna coupling purposes, it is not an essential part of the RF PA in terms of integration. That is, an entire RF PA may be considered to be fabricated on a single monolithic integrated circuit whether capacitor 352 is on-chip or not.

An inductor 354 (0.7 nH, Q about 40) and a capacitor 356 (18 pF) may serve to decouple the output of the HP amplifier block from the supply voltage $V_{DD}$, and to affect the output impedance. Inductor 354 and capacitor 356 thus serve the same purpose as do inductor 324 and capacitor 326 with respect to the output of amplifying blocks LP 106 and MP 108.

With 50 ohms at the input IN 102, the exemplary design operating in the low power mode is intended to establish a signal impedance of 51+j88 ohm at the input to the amplifier block LP 106, and of 160+j170 ohms at the output. In medium power operation, the input and output impedance of the medium amplifier block MP 108 is intended to be 7.3+j12.6 ohms, and 22.9+j24.3 ohms, respectively. In high power operation, the input and output impedance of the high power amplifier block HP 118 is intended to be 1+j1.5 ohms and 2.6+j2.7 ohms.

The values provided for the components shown in FIG. 3 serve to illustrate the principles of the RF PA. Though believed suitable for the exemplary design, errors are possible, and a designer should certainly verify or modify values for a particular application. The expected signal impedance of the exemplary design is nominally 50 ohms resistive at the input, and the switchable matching circuitry is intended to establish a selected or nominal impedance of 50 ohms resistive at the output in all operating modes. However, the output impedance may vary significantly from such selected value and still be considered approximately the same. It may range, for example, by a factor of two above or below nominal, thus between 25 and 100 ohms when the nominal impedance is 50 ohms resistive. Moreover, it may have a significant reactive component giving it an angle between 35 degrees more capacitive and 35 degrees more inductive than the nominal value. The nominal output impedance may be different in the case that the capacitor 352 is off-chip, but variations in the nominal output impedance between different power modes will, nonetheless, typically fall within the indicated range.

Figure 4:
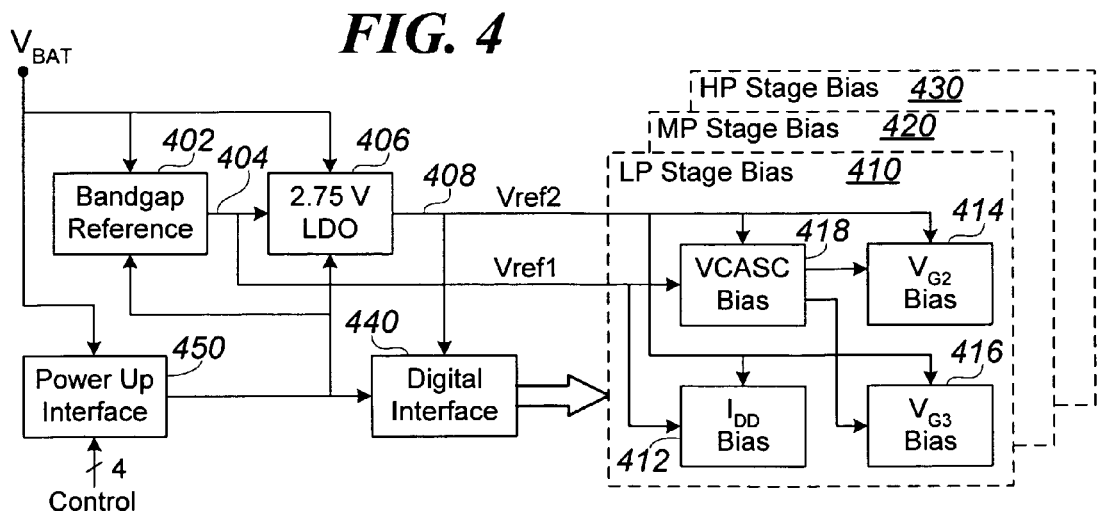
FIG. 4 illustrates considerations for interfacing to a device using the RF PA of the present disclosure, and for individually controlling biasing in three active amplifier PA stages.

FIG. 4 illustrates the architecture of the bias control circuitry in the exemplary embodiment. A bandgap reference 402 has an output 404 that serves as a first reference voltage Vref1 for the bias circuitry. Vref1 404 also controls a low differential output (LDO) voltage regulator 406 having an output 408 at 2.75 V which serves as a second reference voltage Vref2 for the bias circuitry.

In the exemplary embodiment, each amplifier device LP 106, MP 108 and HP 118 includes M1 202, M2 204 and M3 206 as illustrated in FIG. 2. An LP Stage Bias control block 410 provides biasing only for LP 106. In block 412 it establishes a value for $I_{DD}$ Bias, the quiescent voltage level of the signal input to LP 106. In block 414 it produces $V_{G2}$ Bias, the bias for M2 204; and in block 416 it produces $V_{G3}$ Bias, the bias for M3 206. In block 418 it also produces VCASC Bias, bias voltages for the configuration and switching circuits used in a switchable matching network. An MP Stage Bias control block 420 provides analogous bias voltages for the amplifier device MP 108, and an HP Stage Bias control block 430 similarly provides bias for the device HP 118.

A digital interface 440 may receive information reflecting operational states, such as the current power mode and activity level or shutdown overrides, and may translate that information into particular bias voltage selections by means as simple as a lookup table, or by any other convenient means. The information may be received partly or wholly as serial data in order to minimize connections. The mechanism by which the operational information is translated to particular bias values, such as a lookup table, may be adjusted during fabrication or testing to compensate for manufacturing process variations. It may also be made variable depending upon values such as supply voltages and temperatures.

A power up interface 450 may be responsive to the battery voltage and other power-up issues. The power up interface 450 may override control signals otherwise provided by a processing system associated with the transceiver. Thus, each individual PA amplifier block (LP 106, MP 108 and HP 118) may be dynamically configurable, and/or may be adjusted for optimal performance across variations in manufacturing process, operating temperature, etc. Such individual digital control of a plurality, or a multiplicity, of bias values for each of the PA amplifier devices may be a requirement for any claimed RF PA or RF amplification method defined in accordance with this description.

Many advantages may accrue to embodiments of an RF PA as defined in accordance with this description. For example, integrated circuit area is conserved when all lower power PA device blocks also provide useful amplification in the highest power mode. As another example, a matching network parallel to the largest PA block, which is used in the medium and low power modes, may be switched such that it has a very small loading effect in high power mode, thereby retaining high efficiency and output power. As yet another example, the switchable matching networks have sufficient degrees of design freedom to readily be designed to provide good isolation from the signal paths, thereby helping to keep the PA stable. Yet further, the individual control of biasing in amplifier blocks may be employed to improve the linearity of the overall amplification, particularly by biasing parallel blocks such as LP 106 and MP 108 at different levels. The architecture provides the possibility of extraordinary control and adjustment by means of processing decisions taken on the RF PA or by means of processing decisions made in an associated device such as the processing circuitry of a cellular telephone.

CONCLUSION

The foregoing description illustrates exemplary implementations, and novel features, of an RF PA and a method of amplifying RF signals for a portable transceiver. The skilled person will understand that various omissions, substitutions, and changes in the form and details of the methods and apparatus illustrated may be made without departing from the scope of the invention. Because it is impractical to list all embodiments explicitly and separately, it is to be understood that each practical combination of the features set forth above (or conveyed by the figures) that is suitable for embodiments of the RF PA or method is to be considered to define claimable subject matter. Moreover, each practical combination of equivalents of such apparatus or method alternatives also constitutes a distinct alternative embodiment of the subject apparatus or methods. Therefore, the scope of the disclosed apparatus and method should be determined only by reference to such claims as may ultimately be thus based on the foregoing description. Such claims are not to be limited by features illustrated in the foregoing description except insofar as such limitation is recited, or intentionally implicated, in a claim set forth in a resulting issued patent.

The transistors in stacked-transistor RF switches as described herein are, in one embodiment, of an insulated-gate type, or are biased so as to conduct no DC gate current. In some embodiments, the transistors comprise FETs, particularly those referred to as MOSFETs, although that includes many FETs that are not fabricated with traditional Metal/Oxide/Semiconductor layers, as was once implied by the name. The FETs have been described as if they comprise N polarity (NMOS), but they could equally comprise PMOS, or a mixture of both types. Embodiments may employ non-preferred transistors, though they may require circuit adjustments to accommodate control-node DC currents.

The circuits illustrated and described herein are exemplary only, and should not be seen as establishing limitations not expressly required by the claims set forth below. The circuit illustrations should be understood to also effective encompass, and adequately describe, such alternatives as may be readily seen to be analogous by a person of skill in the art, whether by present knowledge common to such skilled persons, or in the future in view of unforeseen but readily-applied alternatives then known to such skilled persons.

All variations coming within the meaning and range of equivalency of the various terms in which the invention is summarized in the Summary section are intended to be embraced within the scope of such term for purposes of determining the scope of such invention summary or claim.

What is claimed is:

1. An RF (radio frequency) PA (power amplifier) for amplifying an RF signal between a source node IN and an output node OUT in a selectable plurality of output power ranges including a low power range and a high power range, the RF PA comprising:
    a) a low power active amplifier device configured as a final amplification stage when the RF PA operates in the low power range, and configured as a first amplification stage when the RF PA operates in the high power range; and
    b) a high power active amplifier circuit configured to conduct significant operating current and to amplify a signal previously amplified by the low power active amplifier device when the RF PA operates in the high power range, and configured to conduct less than 5% of the significant operating current when the RF PA operates in the low power range.

2. The RF PA of claim 1, wherein the high power active amplifier circuit is configured to conduct less than 0.5% of the significant operating current when the RF PA operates in the low power range.

3. The RF PA of claim 1, further comprising a medium power active amplifier circuit configured to conduct a suitable operating current when the RF PA operates in a medium power range or in the high power range, but to conduct less than 5% of the suitable operating current when the RF PA operates in a low power range.

4. The RF PA of claim 3 wherein an output of the medium power active amplifier device is coupled directly to the output of the low power active amplifier device, and both devices are configured to amplify the signal when the RF PA operates in the medium power range.

5. The RF PA of claim 1, further comprising matching circuitry configurable by configuration switches to establish an approximately same selected impedance at the output node OUT regardless of a power range in which the RF PA operates, including high power matching circuitry disposed to match impedance between an output of the high power active amplifier circuit and the output node OUT that includes no configuration switch intended to conduct when the RF PA operates in the high power range.

6. The RF PA of claim 5, wherein circuitry configured to match an output of the low power amplifier device to the RF PA output OUT includes the high power matching circuitry when the RF PA operates in any power range other than the high power range.

7. The RF PA of claim 4, wherein all components of the RF PA are fabricated by a same integrated circuit process.

8. The RF PA of claim 7, wherein the integrated circuit process is CMOS silicon on insulator.

9. The RF PA of claim 6, wherein all FETs forming part of any configuration switch or any active amplifier device have an insulated gate.

10. The RF PA of claim 9, further fabricated on a single monolithic integrated circuit.

11. A method of amplifying an RF (radio frequency) signal between an input node IN and an output node OUT of an RF PA (power amplifier) in a selectable plurality of power ranges including a low power range and a high power range, comprising:
    a) selecting a low power range, and while operating in that range
        i) coupling a signal presented on the input node IN to an input of a low power active amplifier device,
        ii) amplifying the signal between the input and an output of the low power active amplifier device, and
        iii) coupling the amplified signal from the output of the low power active amplifier device to the output node OUT without further amplification, b) selecting a high power range, and while operating in that range
   i) coupling a signal presented on the input node IN to an input of the low power active amplifier device,
   ii) amplifying the signal between the input and the output of the low power active amplifier device,
   iii) coupling the amplified signal from the output of the low power active amplifier device to an input of a high power active amplifier device,
   iv) amplifying the signal between the input and an output of the high power active amplifier device, and
   v) coupling the signal amplified by both the low power active amplifier device and the high power active amplifier device from the output of the high power active amplifier device to the output node OUT.

12. The method of claim 11, further comprising conducting at least 200 times more current in the high power active amplifier device when operating in the high power range than when operating in the low power range.

13. The method of claim 11, further comprising c) selecting a medium power range, and while operating in that range
   i) coupling a signal presented on the input node IN to an input of a medium power active amplifier device,
   ii) amplifying the signal between the input and an output of the medium power active amplifier device, and
   iii) coupling the amplified signal from the output of the medium power active amplifier device to the output node OUT without further amplification.

14. The method of claim 13, further comprising amplifying the signal by means of the low power amplifier device between the input node IN and the output of the medium power amplifier when operating in the medium power range.

15. The method of claim 11, further comprising coupling a high power signal at the output of the high power amplifier device to the output node OUT when operating in the high power range via high power matching circuit elements without conducting the high power signal through a configuration switch, and switching matching circuit elements via configuration switches in all selectable ranges to establish an impedance of the signal at the output node OUT to have an approximately same nominal value.

16. The method of claim 15, further comprising coupling the amplified signal to the output node OUT via the high power matching circuit elements when operating in any power range other than the high power range.

17. The method of claim 16, further comprising amplifying, switching and conditioning the signal from the input node IN to the output node OUT exclusively via elements fabricated by a same integrated circuit process.

18. The method of claim 17, wherein the same integrated circuit process is a CMOS silicon on insulator process.

19. The method of claim 14, further comprising amplifying and switching the signal from the input node IN to the output node OUT via FETs without using any non-insulated gate FETs.

20. The method of claim 19, further comprising amplifying, switching and conditioning the signal from the input node IN to the output node OUT exclusively via elements fabricated on a same monolithic integrated circuit.

* * * * *